US010651789B2

(12) United States Patent
Zhang et al.

(10) Patent No.: US 10,651,789 B2
(45) Date of Patent: May 12, 2020

(54) PULLABLE CLOCK OSCILLATOR

(71) Applicant: TEXAS INSTRUMENTS INCORPORATED, Dallas, TX (US)

(72) Inventors: Ben-yong Zhang, Auburn, WA (US); Seong-Ryong Ryu, Pleasanton, CA (US); Ali Kiaei, San Jose, CA (US); Ting-Ta Yen, San Jose, CA (US); Kai Yiu Tam, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/719,540

(22) Filed: Sep. 28, 2017

(65) Prior Publication Data
US 2018/0091095 A1 Mar. 29, 2018

Related U.S. Application Data

(60) Provisional application No. 62/401,036, filed on Sep. 28, 2016.

(51) Int. Cl.
| H03B 5/36 | (2006.01) |
| H03B 1/04 | (2006.01) |
| H03B 5/32 | (2006.01) |
| H03B 1/02 | (2006.01) |
| H03L 7/099 | (2006.01) |

(Continued)

(52) U.S. Cl.
CPC ............... *H03B 1/04* (2013.01); *H03B 1/02* (2013.01); *H03B 5/326* (2013.01); *H03B 5/366* (2013.01); *H03B 5/368* (2013.01); *H03L 7/099* (2013.01); *H03B 2200/004* (2013.01); *H03B 2200/009* (2013.01); *H03L 7/0891* (2013.01); *H03L 7/093* (2013.01)

(58) Field of Classification Search
CPC . H03B 5/30; H03B 5/32; H03B 5/326; H03B 5/36; H03B 5/364; H03B 5/366; H03B 2200/004; H03B 2200/009
See application file for complete search history.

(56) References Cited

U.S. PATENT DOCUMENTS 9,071,194 B1 * 6/2015 Djahanshahi ............ H03B 5/30
9,413,341 B1 * 8/2016 Ho .......................... H03B 5/364
(Continued)

OTHER PUBLICATIONS

Texas Instruments. "LMK05318 Ultra-Low Jitter Network Synchronizer Clock with Two Frequency Domains." SNAS771A-Dec. 2018-Revised Dec. 2018, pp. 1-86.

*Primary Examiner* — Levi Gannon
(74) *Attorney, Agent, or Firm* — Ray A. King; Charles A. Brill; Frank D. Cimino

(57) ABSTRACT

A clock oscillator includes with a pullable BAW oscillator to generate an output signal with a target frequency. The BAW oscillator is based on a BAW resonator and voltage-controlled variable load capacitance, responsive to a capacitance control signal to provide a selectable load capacitance. An oscillator driver (such as a differential negative gm transconductance amplifier), is coupled to the BAW oscillator to provide an oscillation drive signal. The BAW oscillator is responsive to the oscillation drive signal to generate the output signal with a frequency based on the selectable load capacitance. The oscillator driver can include a bandpass filter network with a resonance frequency substantially at the target frequency.

6 Claims, 4 Drawing Sheets

(51) Int. Cl.
    *H03L 7/093*    (2006.01)
    *H03L 7/089*    (2006.01)

(56) References Cited

U.S. PATENT DOCUMENTS

| | | | |
|---|---|---|---|
| 9,954,541 B1* | 4/2018 | Goyal | H03L 7/099 |
| 2002/0190802 A1* | 12/2002 | Ruffieux | H03B 5/326 |
| | | | 331/100 |
| 2004/0180640 A1* | 9/2004 | Zipper | H03B 5/368 |
| | | | 455/196.1 |
| 2007/0004362 A1* | 1/2007 | Der | H03J 1/00 |
| | | | 455/262 |
| 2009/0058546 A1* | 3/2009 | Yajima | H03B 5/364 |
| | | | 331/116 FE |
| 2011/0018649 A1* | 1/2011 | David | H03B 5/326 |
| | | | 331/158 |
| 2018/0091095 A1 | 3/2018 | Zhang et al. | |

\* cited by examiner

PULLABLE CLOCK OSCILLATOR

CROSS-REFERENCE TO RELATED APPLICATIONS

Priority is claimed under 37 CFR 1.78 and 35 USC 119(e) to U.S. Provisional Application 62/401,036, filed 2016 Sep. 28, which is incorporated by reference.

BACKGROUND

Technical Field

This Patent Disclosure relates to pullable clock oscillators, such as a voltage controlled crystal oscillator.

Related Art

A VCXO (voltage controlled crystal oscillator) is a type of pullable oscillator where the output frequency from a quartz crystal is controlled by a circuit voltage based on a variable load capacitance. Pullability refers to frequency shift (deviation) as a function of the control voltage, expressed in parts per million (ppm). Absolute pull range (APR), also referred to as tracking range. is a specified pullable frequency shift (ppm) from a nominal, target frequency over operating parameters, such as frequency tolerance, frequency stability over operating temperature range, supply voltage, output load and aging.

Due to limitations of crystal manufacturing technology, operating frequencies of pullable crystal resonators used for VCXO are typically less than a few hundred MHz. Alternative pullable oscillators can be based on a SAW resonator, or an LC tank resonator. A SAW-based VCSO can achieve higher frequency, in the range of 1-2 GHz, but is bulky compared to the integrated circuitry used to implement the VCSO. VCOs based on LC tanks can also achieve high frequencies, but close-in phase noise of an LC VCO is significantly worse than a VCXO or VCSO at comparable operating frequencies.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a clock oscillator with a pullable BAW oscillator based on a BAW resonator and voltage-controlled variable load capacitance.

According to aspects of the Disclosure, a clock oscillator includes with a pullable BAW oscillator to generate an output signal with a target frequency. The BAW oscillator is based on a BAW resonator and voltage-controlled variable load capacitance, responsive to a capacitance control signal to provide a selectable load capacitance. An oscillator driver (such as a differential negative gm transconductance amplifier), is coupled to the BAW oscillator to provide an oscillation drive signal. The BAW oscillator is responsive to the oscillation drive signal to generate the output signal with a frequency based on the selectable load capacitance. The oscillator driver can include a bandpass filter network with a resonance frequency substantially at the target frequency.

Other aspects and features of the invention claimed in this Patent Document will be apparent to those skilled in the art from the following Disclosure.

DETAILED DESCRIPTION

This Description and the Drawings constitute a Disclosure for a clock oscillator with a pullable BAW oscillator based on a BAW resonator with a variable load capacitance, including describing design examples (example implementations), and illustrating various technical features and advantages.

An example implementation is as a voltage controlled BAW oscillator (VBCO), such as for use in an example application as a clock generator or clock jitter cleaner.

In this Disclosure, clock jitter is used to describe clock signal quality. Clock jitter typically is defined/measured in time domain, such as period jitter, cycle-to-cycle jitter, and accumulated jitter. Clock jitter can also be defined/measured in frequency domain, such as integrated rms (root mean square) jitter, which is calculated based on measured phase noise spectrum.

In brief overview, in example embodiments, a clock oscillator includes with a pullable BAW oscillator to generate an output signal with a target frequency. The BAW oscillator is based on a BAW resonator and voltage-controlled variable load capacitance, responsive to a capacitance control signal to provide a selectable load capacitance. An oscillator driver (such as a differential negative gm transconductance amplifier), is coupled to the BAW oscillator to provide an oscillation drive signal. The BAW oscillator is responsive to the oscillation drive signal to generate the output signal with a frequency based on the selectable load capacitance. The oscillator driver can include a bandpass filter network with a resonance frequency substantially at the target frequency.

Figure 1:
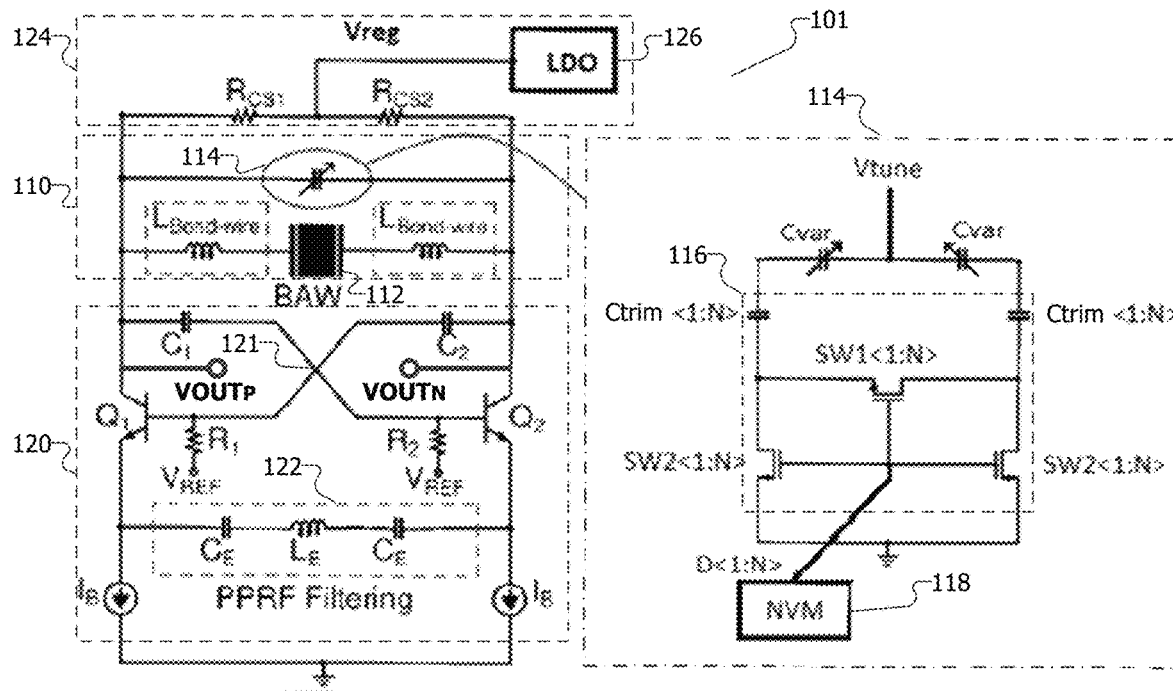
FIG. 1 illustrates an example clock oscillator [101] with a pullable BAW oscillator [110] based on a BAW resonator [112] and voltage-controlled variable load capacitance [114], implemented as a voltage controlled BAW oscillator (VBCO), including an oscillation drive stage [120] implemented as a differential negative gm transconductance amplifier with cross-coupled NPN [121] with an emitter-coupled bandpass filter [122] to filter parasitic parallel resonance frequencies (PPRF).

FIG. 1 illustrates an example clock oscillator 101 with a pullable BAW (bulk acoustic wave) oscillator 110, implemented as a voltage controlled BAW oscillator, referred to in this Disclosure as a VCBO.

The example VCBO includes an active oscillator core with the pullable BAW oscillator 110 and a differential negative gm oscillation drive stage 120. BAW oscillator 110 is based on a BAW resonator 112 and a voltage-controlled variable load capacitance 114.

The example variable load capacitance 114 is implemented with dual varactors Cvar, controlled by a Vtune control voltage. Coarse capacitance adjustment is provided by a switched coarse capacitor array 116 including capacitors Ctrim switched by a switch network SW1/SW2 controlled by trim code stored in NVM (nonvolatile memory) 118.

The varactors Cvar and the switched coarse capacitor array 116 provide high-Q tuning load capacitance for the BAW oscillator 110. The trim code (control word) for switched coarse capacitor array can be determined during factory calibration and the result is stored in NVM 118. Using this coarse capacitance trim approach, the target frequency of VCBO can be trimmed within 10's of ppm in the manufacturing process, avoiding digital coarse calibration, and improving oscillator lock time.

The varactors Cvar can be controlled by an analog tuning voltage Vtune, which provides sufficient pull-in range to compensate for frequency shift/deviation caused by factors such as residue error from factory calibration, temperature, and power supply variations, as well as BAW resonator aging. The varactors Cvar can be designed so that the VCBO can meet specified APR (absolute pull range) specifications such as +/−50 ppm.

For a PLL implementation such as described in connection with FIG. 4, the Vtune control voltage can be provided by a PLL PFD/CP through the PLL loop filter.

An example differential oscillation drive stage 120 drives the BAW oscillator 110. The oscillation drive stage 120 is implemented as a differential negative gm transconductance amplifier with cross-coupled NPN 121, with AC coupling capacitors C1/C2. Biasing is provided by resistors R1/R2, and tail current sources $I_B$. The tail current sources can be implemented with bipolar, MOS and/or resistors.

VCBO output is at the collector terminals VOUTp and VOUTn.

Figure 2:
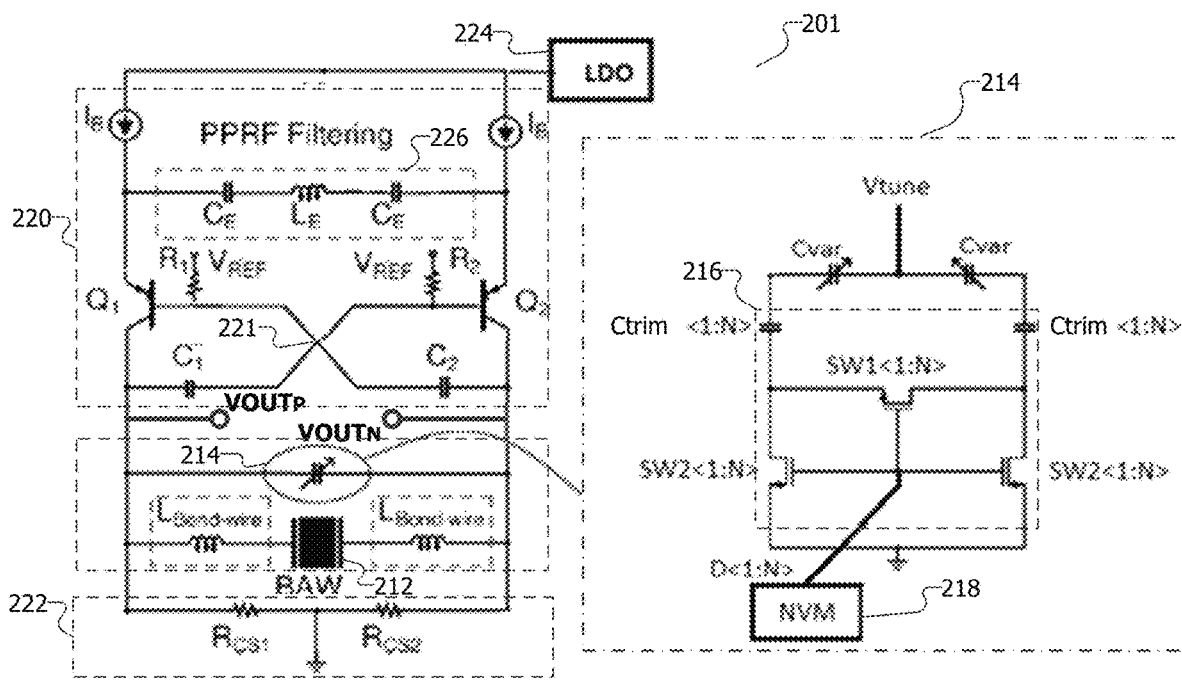
FIG. 2 illustrates an example alternative implementation of a VCBO [201] with a pullable BAW oscillator [210] based on a BAW resonator [212] and variable load capacitance [214], and with an oscillation drive stage [220] implemented as a negative gm transconductance amplifier with cross-coupled PNP [221].

FIG. 2 illustrates an example alternative implementation of a VCBO 201 with a pullable BAW oscillator 210 based on a BAW resonator 212 and variable load capacitance 214. VCBO 201 is implemented with an oscillation drive stage 220 implemented as a negative gm transconductance amplifier with cross-coupled PNP 221. VCBO 201 operates substantially the same as VCBO 101, and will not be described in detail.

Alternatively, NMOS/PMOS devices can replace NPN/PNP devices Q1, Q2 in the example implementations in FIGS. 1 and 2. A disadvantage of using MOS devices is worse 1/f noise. Furthermore, using MOS devices may reduce VCBO tuning range due to its larger parasitic capacitance for generating a similar gm.

Referring back to FIG. 1, the example oscillation drive stage 120 for the active oscillator core includes an emitter-coupled bandpass filter 122. The example bandpass filter 122 is implemented as an emitter coupled parallel $C_E$-$L_E$-$C_E$ resonant circuit configured to filter parallel resonance frequencies, and is referred to as a PPRF (parallel resonance frequency) filter.

The PPRF filtering network 122 resonates, i.e. its impedance is around zero, near the target VCBO operating frequency (for example, 2.5 GHz). Hence, the negative gm can be maximized around the VCBO target operating frequency, and is reduced at higher frequencies or near DC.

Figure 3:
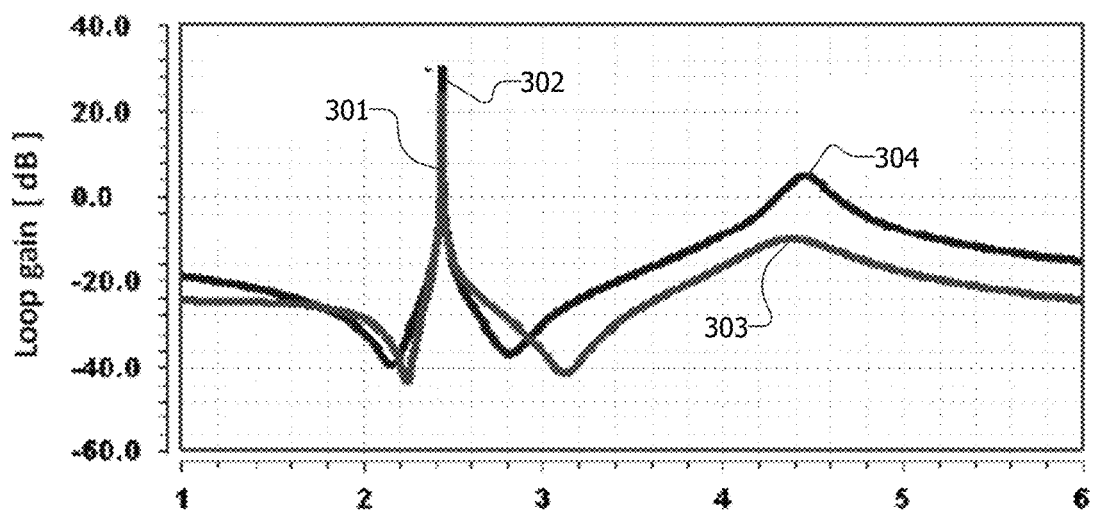
FIG. 3 is an example plot illustrating the effect of including PPRF filtering in the oscillation drive stage to allow oscillation at a target frequency [301, 302], with PPRF filtering to suppress parasitic resonance frequency oscillations [303, 304].

FIG. 3 is an example plot illustrating the effect of including PPRF filtering in the oscillation drive stage. Plot 301/303 illustrates a VCBO with active core PPRF filtering, in comparison to Plot 302/304 for a VCBO with AC coupling but without PPRF filtering.

The PPRF filtering allows oscillation at a target frequency 301, with PPRF filtering to suppress parasitic resonance frequency oscillations 303 (for example, 10 dB down in comparison to the parasitic resonance frequency at 304). This type of frequency response prevents the oscillator being stuck at DC operating point, or oscillating at an undesired parasitic parallel resonance frequency.

The example drive stage 120 includes a resistive load 124 with an LDO supply 126. The LDO provides a low noise supply to the VCBO, which also reduces the impact of noise and spurious components from the external power supply. Resistors RCS1 and RCS2 provide proper load for the differential NPN devices Q1, Q2, and are part of the bias circuitry of the BAW oscillator 110.

Alternative load schemes include an active PMOS mirror load (or active NMOS load for alternative implementation using PNP devices in FIG. 2).

Figure 4:
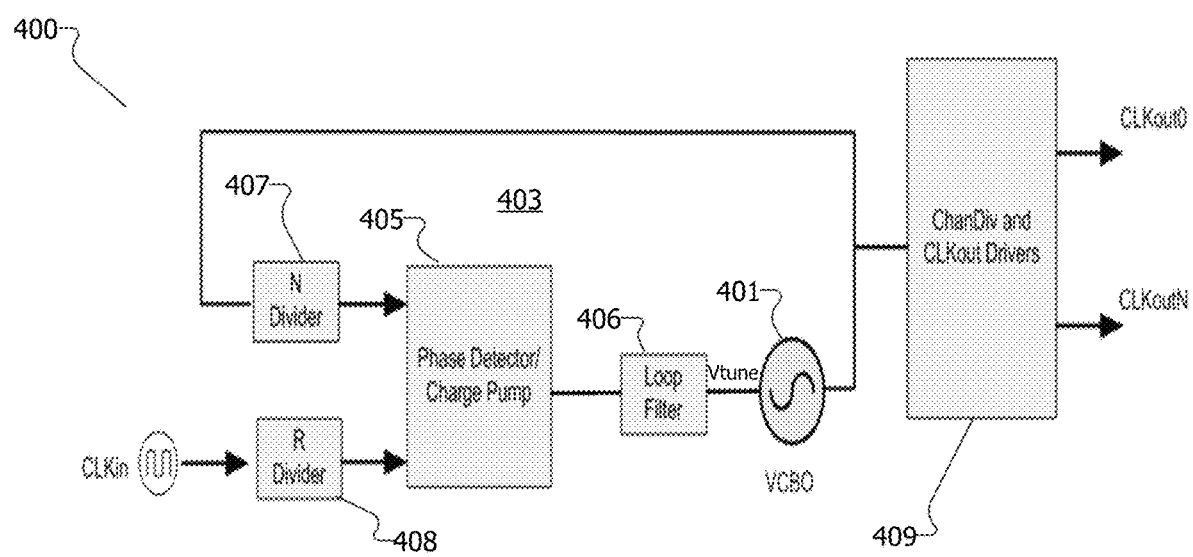
FIG. 4 illustrates an example clock generator or clock jitter cleaner [400] implemented with a VCBO [401] according to this Disclosure, the VCBO incorporated into a charge-pump PLL [403] including a PFD/CP [405] and loop filter [406] that provide a Vtune control signal to the VCBO.

FIG. 4 illustrates an example application of a VCBO according to this disclosure in a clock generator or clock jitter cleaner 400. For clock system 400, a VCBO 401 is incorporated into a charge-pump PLL 403.

CP-PLL includes a PFD/CP 405 and a loop filter 406. The feedback loop includes a feedback divider 407. PFD 405 receives a reference clock through a reference path that includes a reference divider 408 to generate a reference frequency, which is compared to the divided feedback frequency 407.

The PFD/CP 405 and loop filer 406 provide a Vtune control signal to the VCBO. Referring to FIG. 1, the Vtune control signal is input to the variable load capacitance circuit 114 in the BAW oscillator 110.

Figure 5A:
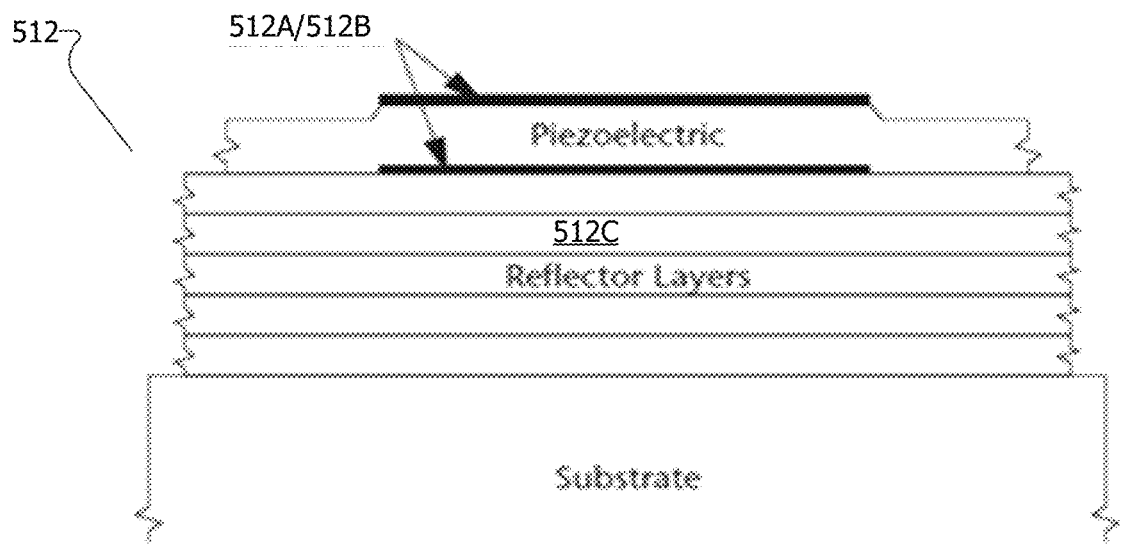
FIG. 5A illustrates an example structure for a BAW resonator [512], including piezoelectric electrodes [512A, 512B], and stacked reflector layers [512C].

FIG. 5A illustrates an example structure for a BAW resonator 512 providing a stable, high-Q resonator element. BAW resonator structure 512 includes piezoelectric electrodes 512A, 512B, and stacked reflector layers 512C. BAW resonator 512 can be structured as a thin film resonator similar to the basic quartz crystal scaled down in size. As illustrated, the BAW resonator structure 512 includes a piezoelectric film between two metal films 512A/512B, with the stacked reflector layers 512C used to confine mechanical energy. The end result is a stable high-Q resonator element.

Figure 5B:
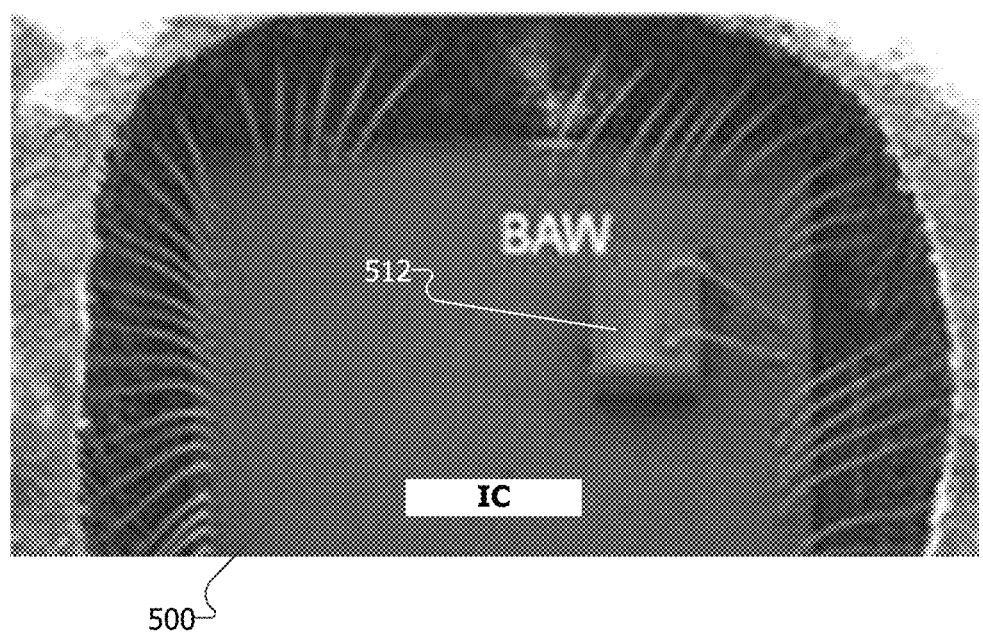
FIG. 5B illustrates a BAW resonator [512] co-packaged with an IC [500] based on a VCBO according to this Disclosure, such as a clock system including a VCBO (FIG. 4), or as a stand-alone VCBO (FIGS. 1/2).

FIG. 5B illustrates a BAW resonator [512] co-packaged with an IC 500 based on a VCBO according to this Disclosure. For example, IC 500 can be a clock system IC including a VCBO, such the clock generator or jitter cleaner (FIG. 4), or a stand-alone VCBO (FIGS. 1/2).

Figure 6:
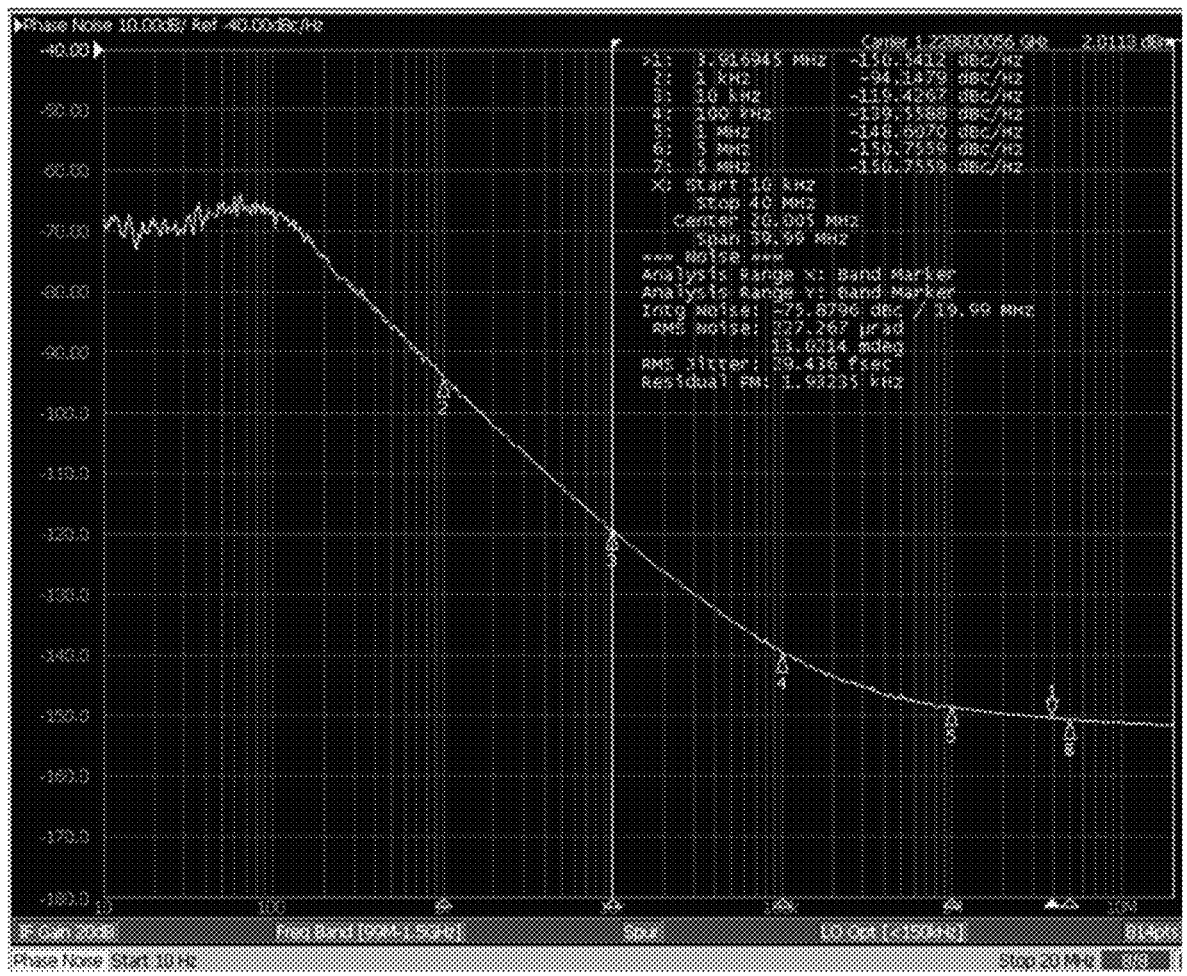
FIG. 6 illustrates example RMS jitter and phase noise measurement results for an example high-frequency (>2 GHz) VCBO according to this Disclosure.

FIG. 6 illustrates example RMS jitter and phase noise measurement results for an example high-frequency (>2

GHz) VCBO according to this Disclosure. In this example, RMS jitter integrated from 10 KHz to 20 MHz is approximately 30 fs.

The Disclosed VCBO can be used to implement a high frequency (>2 GHz) low-noise pullable oscillator based on a BAW oscillator, including a BAW resonator with a voltage-controlled variable load capacitance, and an active core. The BAW resonator can be co-packaged with an IC device, such as in a QFN type of package. The VCBO provides phase noise/jitter performance comparable to that of a VCXO or VCSO, with small size and low cost. High frequency clocks (up to VCBO operating frequency) can be generated without requiring an additional frequency-multiplying PLL.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including example design considerations, can be used by ordinarily skilled artisans as a basis for modifications, substitutions and alternatives to construct other embodiments, including adaptations for other applications.

The invention claimed is:

1. A circuit for generating an output signal with a target frequency, comprising:
    a BAW (bulk acoustic wave) oscillator, including
        a BAW resonator, and
        a variable load capacitance coupled to the BAW resonator, and responsive to a capacitance control signal to provide a selectable load capacitance;
    an oscillator driver coupled to the BAW oscillator to provide an oscillation drive signal,
        the oscillator driver including:
            a differential negative gm transconductance amplifier with cross-coupled transistors, and
            a PPRF (parasitic parallel resonance frequency) filter providing band-pass filtering at a resonance frequency substantially at the target frequency, coupled to the emitters of the cross-coupled transistors;
    the BAW oscillator responsive to the oscillation drive signal to generate the output signal with a frequency based on the selectable load capacitance.

2. The circuit of claim 1, wherein the oscillator driver includes a bandpass filter with a resonance frequency substantially at the target frequency.

3. The circuit of claim 1, wherein the PPRF filter network comprises a capacitance-inductance-capacitance circuit.

4. The circuit of claim 1, wherein the variable capacitance circuitry comprises:
    a course capacitor array including at least first and second course capacitors coupled to respective sides of the BAW resonator, each capacitor having a capacitance determined by a control word; and
    an NVM (non-volatile memory) to store the control words for each course capacitor.

5. The circuit of claim 1, wherein:
    the oscillator driver is a voltage controlled oscillator circuit;
    the capacitance control signal is a Vtune voltage signal provided by the voltage controlled oscillator circuit.

6. The circuit of claim 5, wherein the voltage controlled oscillator circuit is included in a clock generator that includes a PLL with a PLL loop filter that outputs the Vtune voltage signal.

\* \* \* \* \*